(12) United States Patent
Kim et al.

(10) Patent No.: US 6,295,328 B1
(45) Date of Patent: Sep. 25, 2001

(54) FREQUENCY MULTIPLIER USING DELAYED LOCK LOOP (DLL)

(75) Inventors: Beom Sup Kim; Joon Suk Lee, both of Daejon (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 09/025,112

(22) Filed: Feb. 17, 1998

(30) Foreign Application Priority Data

Feb. 20, 1997 (KR) .................................................. 5133/97

(51) Int. Cl.[7] ...................................................... H03D 3/24
(52) U.S. Cl. ......................... 375/376; 327/116; 327/149; 327/150; 327/158; 327/159
(58) Field of Search ..................... 375/371, 373, 375/374, 375, 376; 327/147, 149, 150, 156, 158, 159, 116, 119, 141, 244, 250, 276

(56) References Cited

U.S. PATENT DOCUMENTS 5,105,108 * 4/1992 Ngo ...................................... 327/158
5,259,007 11/1993 Yamamoto ............................ 375/120
5,815,016 * 9/1998 Erickson ............................... 327/158

* cited by examiner

Primary Examiner—Chi Pham
Assistant Examiner—Jean B Corrielus
(74) Attorney, Agent, or Firm—Fleshner & Kim, LLP

(57) ABSTRACT

A frequency multiplier is provided that increases operational stability by using a Delay Locked Loop (DLL). The frequency multiplier includes a phase detector for detecting a phase difference between an input signal and a feed-back signal, a loop filter for outputting a control signal based on the phase difference detected by the phase detector and a voltage-controlled delay unit for varying a delay ratio of the input signal and outputting divided signals in accordance with the control signal from the loop filter. A first SR flip-flop receives a pair of earlier output signals that are divided into 1/4 and 2/4 period signals from the voltage-controlled delay unit and outputs a first duty cycle signal. A second SR flip-flop receives a pair of later output signals that are divided into 3/4 and 4/4 period signals from the voltage-controlled delay unit and outputs a second duty signal. A logic circuit such as an OR-gate receives the outputs from the first and second SR flip-flops and outputs a signal having a predetermined duty cycle, for example, a 50% duty cycle. The frequency multiplier further has reduced size and power requirements.

22 Claims, 3 Drawing Sheets

FREQUENCY MULTIPLIER USING DELAYED LOCK LOOP (DLL)

BACKGROUND OF THE INVENTION

1. Field of the Invention

The present invention relates to a frequency multiplier, and in particular, to a frequency multiplier for generating a high frequency signal such as a clock signal.

2. Background of the Related Art

In general, higher frequency circuits are being increasingly used. Therefore, a high frequency clock signal is needed for such high frequency circuits. However, when generating a high frequency signal using a crystal oscillation method, jitter is increasingly generated. To avoid the jitter problem, one related art method multiplies an intermediate frequency after changing a frequency to the common intermediate frequency.

The frequency multiplier is a circuit for generating a high frequency clock signal. The frequency multiplier circuit can be used in a memory, a microprocessor, a video appliance, an audio appliance, etc. During use, the frequency multiplier is connected in a chip of a clock recovery circuit. Therefore, the frequency multiplier is an element effecting the complexity of the construction and the operational stability of the circuit.

Related art frequency multipliers may be classified into frequency multipliers that use a Phase Locked Loop (PLL) and frequency multipliers that use a Delay Locked Loop DLL).

The related art frequency multiplier using a PLL, as shown in FIG. 1, includes a phase frequency detector (PFD) 10 for detecting a phase/frequency difference between an input signal f1 and a feed-back signal. A loop filter (LF) 11 outputs a control signal in accordance with the difference detected by the phase frequency detector 10. A voltage-controlled oscillator (VCO) 12 is oscillated by the control signal from the loop filter 11 to output a frequency signal. A divider 13 divides the frequency of the signal from the voltage-controlled oscillator 12 and feeds-back the frequency-divided signal as the feed-back signal to the phase frequency detector 10.

The phase frequency detector 10 is implemented by an exclusive OR-gate XOR. The exclusive OR-gate XOR detects a phase difference during the pulse duration of the input signals when the frequency of the signals are close to each other. However, since most commonly used input signals do not have a 50% duty cycle during the pulse duration, the output from the exclusive OR-gate XOR does not have a uniform duty cycle.

When the common pulse durations are identified with each other, the pulse durations between the rising edge and the falling edge are identical. Thus, when the common pulse durations are identical, an edge-triggered phase detector is generally used. Among the edge-triggered phase detectors, a phase frequency detector 10 is generally used.

In addition, the divider 13 includes a T-flip-flop, and the loop filter 11 includes a capacitor formed of an MOS FET gate and a large size capacitor having an n-well to overcome the jitter problem.

The operation of the related art frequency multiplier using the PLL will now be described. First, when a signal having a frequency f1 is inputted, the phase frequency detector 10 detects the difference between the frequency f1 of the input signal and the feed-back signal. Then, the loop filter 11 outputs a control signal corresponding to the frequency difference detected. The loop filter 11 acts as a low pass filter and stabilizes the circuit.

The voltage-controlled oscillator 12 is oscillated by the control signal from the loop filter 11. Thus, the voltage-controlled oscillator 12 outputs a signal having a frequency determined by the control signal. The divider 13 divides the frequency of the signal from the voltage-controlled oscillator 12 and feeds-back the frequency-divided signal to the phase frequency detector 10. When the input signal and the feed-back signal are accurately phase locked and the divider 13 is a one-half divider, then the signal from the voltage-controlled oscillator 12 is a doubled frequency 2f1 relative to the input signal frequency f1.

However, the related art frequency multiplier using a PLL requires a loop filter for stabilizing the PLL circuit. In addition, a large size capacitor is used in the loop filter LF to secure the desired circuit stability. If the capacitance of the loop filter capacitor is increased to improve stability, the capacitor undesirably occupies a larger area in the circuit. Therefore, it is difficult to effectively design the multiplier.

In addition, the related art PLL frequency multiplier uses a voltage-controlled oscillator 12. The voltage-controlled oscillator 12 may be formed of a current starved ring oscillator, a variable capacitor ring oscillator, a variable resistor ring oscillator, and a current-controlled relaxation oscillator.

Important criteria in a voltage-controlled oscillator include a linear characteristic and noise generation level. The operational range of the current starved ring oscillator is wide, but it requires a boot-up circuit and has a poor linearity. The variable capacitor ring oscillator has a noise eliminating effect, it requires an additional circuit such as a bias mirror circuit, a supply independent circuit or the like.

As the construction of the related art voltage-controlled oscillator becomes complicated, additional circuits are required for stable operation and noise occurs. Further, to secure the operational stability and prevent noise occurrence, a loop filter must be included in the frequency multiplier.

To overcome the structural complexity and noise occurrence problems, a frequency multiplier using the Delay Locked Loop (DLL) can be considered as an effective circuit. FIG. 2 illustrates a related art frequency multiplier using a DLL.

As shown in FIG. 2, the related art DLL frequency multiplier using includes a phase detector (PD) 20 for detecting a phase difference between an input signal and a feed-back signal. A loop filter 21 outputs a control signal in accordance with the phase difference detected by the phase frequency detector 20, and a voltage-controlled delay (VCD) line 22 varies the delay ratio of the input signal in accordance with the control signal from the loop filter 21 and feeds-back the delayed signal to the phase detector 20. The voltage-controlled delay line 22 includes four unit delay cells DC1 through DC4 that act as an inverter. The input signal and the output signal from the first unit delay cell DC1 are applied to the inputs of an exclusive-OR gate 23.

The operation of the related art DLL frequency multiplier will now be described. First, when a signal having a frequency f1 is inputted, the phase detector 20 detects a phase difference between the input signal and the feed-back signal. The loop filter 21 outputs the control signal corresponding to the detected phase difference to the voltage control delay line 22. The four unit delay cells DC1 through DC4 of the voltage-controlled delay line 22 adjust the delay ratio of the input signal to vary the phase in accordance with the control signal from the loop filter 21.

The four unit delay cells DC1 through DC4 output signals that are generated by quarter-dividing the input signal in one period. The input signal and the output from the delay cell DC1, which has a 1/4 period difference, are exclusively ORed by the exclusive-OR gate (XOR) 23 to generate a doubled frequency 2f1.

The input for the exclusive-OR gate XOR 23 is not limited to the input signal and the output signal from the delay cell DC1. The outputs from the unit delay cells DC1 through DC4, which have a 1/4 period difference, can be used as the input to the exclusive-OR gate 23.

The construction of the related art DLL frequency multiplier is simple. However, the related art DLL frequency multiplier has various disadvantages. The multiplier has a duty cycle problem because of the exclusive-OR gate 23. In addition, a jitter problem occurs because of the pulse duty cycle that is a critical problem to the performance of the frequency multiplier. In order to eliminate the jitter problem, additional circuitry is necessary.

SUMMARY OF THE INVENTION

An object of the present invention to provide a frequency multiplier that substantially overcomes at least the aforementioned problems encountered in the related art.

Another object of the present invention to provide a frequency multiplier simplifies the construction and increases the operational safety by using a DLL (Delay Locked Loop).

To achieve at least the above objects in a whole or in parts, there is provided a frequency multiplier according to the present invention that includes a phase detector for detecting a phase difference between an input signal and a feed-back signal, a loop filter for outputting a control signal based on the phase difference detected by the phase detector, a voltage controlled delay line for varying a delay ratio of the input signal and outputting a quarter-divided signal in accordance with the control signal from the loop filter, a first flip-flop for receiving a first pair of output signals that are divided by 1/4 and 2/4 from the voltage controlled delay unit and outputting a first duty cycle signal, a second flip-flop for receiving a second pair of output signals that are divided by 3/4 and 4/4 from the voltage controlled delay unit and outputting a second duty cycle signal, and a logic-gate for logically processing outputs from the first and second flip-flops and outputting a signal having a 50% duty cycle.

To further achieve the above objects in a whole or in parts, there is provided an output circuit for a frequency multiplier according to the present invention that includes a voltage-controlled delay unit that varies a delay ratio of an input signal and outputs a divided signal based on a phase difference between the input signal and a feed-back signal, a first output circuit receives a first pair of signals from the voltage-controlled delay unit and outputs a first duty cycle signal, a second output circuit that receives a second pair of signals from the voltage-controlled delay line and outputs a second duty cycle signal, and a logic circuit that logically processes the first and second duty cycle signals from the first and second and outputs circuits outputs a signal with a predetermined duty cycle.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Figure 1:
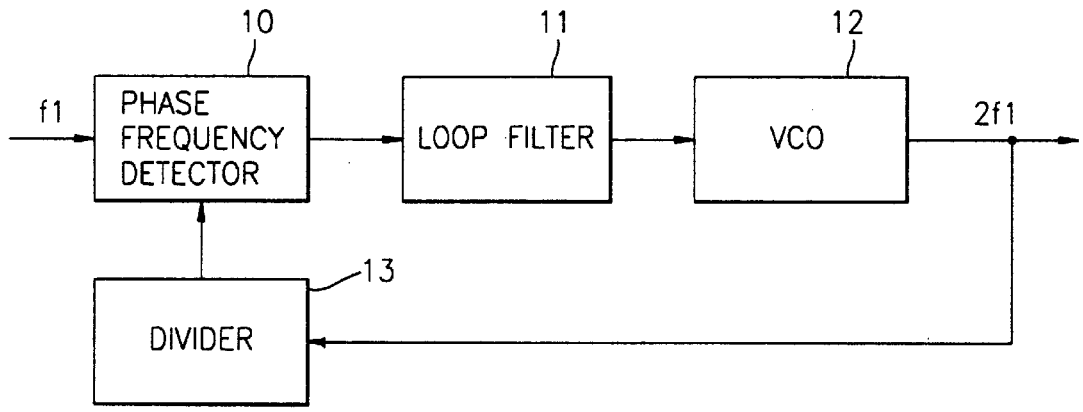
FIG. 1 is a block diagram illustrating a related art frequency multiplier using a (Phase Locked Loop) PLL.
Figure 2:
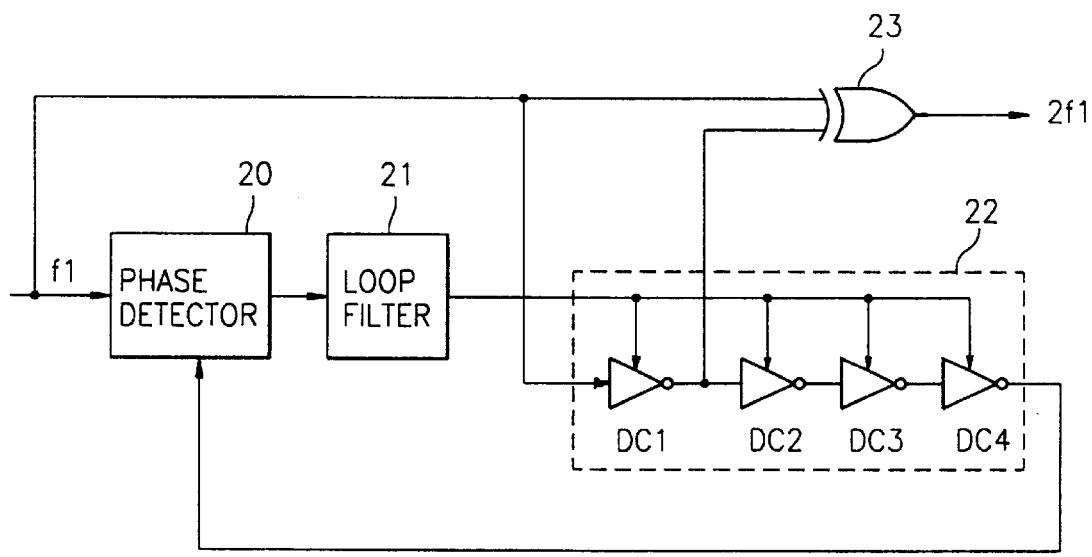
FIG. 2 is a diagram illustrating a related art frequency multiplier using a (Delay Locked Loop) DLL.
Figure 3:
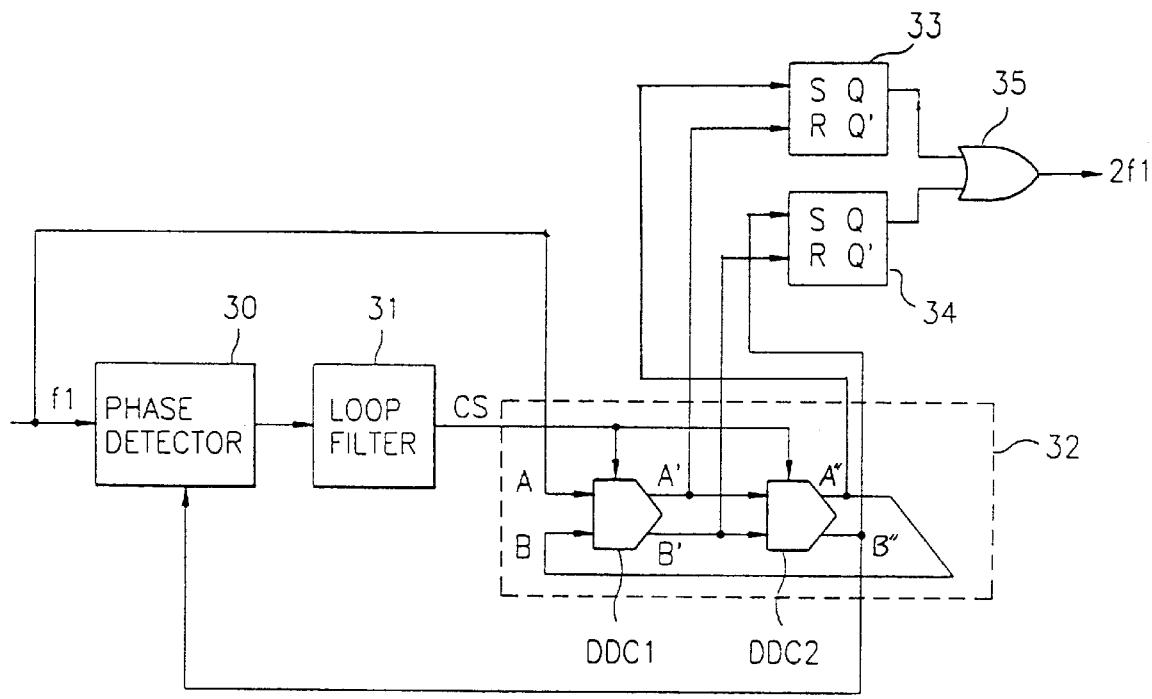
FIG. 3 is a block diagram illustrating one preferred embodiment of frequency multiplier using a DLL according to the present invention.

FIG. 3 illustrates a preferred embodiment of a frequency multiplier using a DLL according to the present invention. A phase detector 30 detects a phase difference between an input signal and a feed-back signal, and a loop filter 31 outputs a control signal based on the phase difference detected by the phase detector 30. A voltage control delay line 32 varies the delay ratio of the input signal and the feed-back signal to the phase detector 30 based on the control signal from the loop filter 31. An SR flip-flop 33 receives a first pair of earlier output signals from the voltage controlled delay line 32 to output a signal with a 25% duty cycle. An SR flip-flop 34 receives a second pair of later output signals from the voltage controlled delay line 32 to output a 25% duty cycle signal. An OR-gate 35 ORs the output signal from the SR flip-flops 33 and 34 to output a 50% duty cycle signal.

Figure 4:
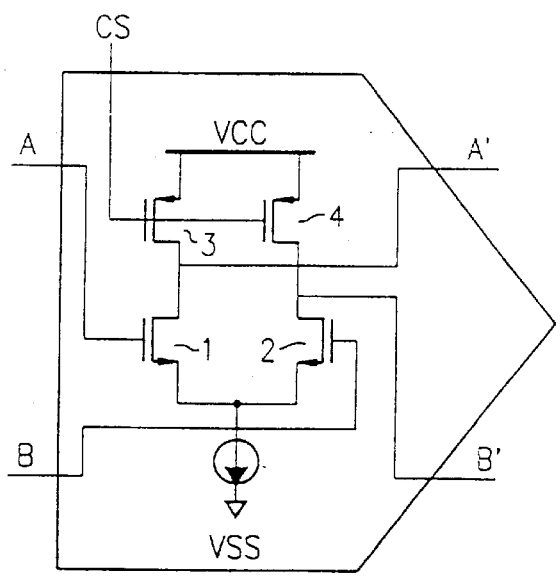
FIG. 4 is a circuit diagram illustrating a differential delay cell in the circuit of FIG. 3.

As shown in FIG. 3, the voltage controlled delay line 32 includes two differential delay cells DDC1 and DDC2. As shown in FIG. 4, in each of the differential delay cells DDC1 and DDC2, two NMOS transistors 1 and 2 are coupled in parallel to a current source that is coupled to ground. Two PMOS transistors 3 and 4 are switched by the control signal from the loop filter 31 and are coupled in parallel to a power supply voltage Vcc. The two PMOS transistors 3 and 4 are also respectively coupled in series with NMOS transistors 1 and 2. As shown in FIG. 3, the loop filter 31 may be substituted by a capacitor.

Operations of the preferred embodiment of the frequency multiplier according to the present invention will now be described. First, when a signal having a frequency f1 is inputted, the phase detector 30 detects a phase difference between the input signal and the feed-back signal. The loop filter 31 receives the phase difference from the phase detector 30 and outputs a control signal to (CS) the voltage control delay line 32 corresponding to the detected phase difference.

The differential delay cells DDC1 and DDC2 of the voltage controlled delay line 32 are controlled by the control signal from the loop filter 31 to adjust a basic delay level. In this manner, the frequency of the signal from the voltage controlled delay line 32 is controlled. The output signal from the voltage controlled delay line 32 is inputted into the phase detector 30 as the feed-back signal. The above-described processes are repeated until the entire loop of the frequency multiplier is locked.

When an input signal and the feed-back signal (i.e., the input of the differential delay cell DDC1 and the output from the voltage controlled delay line 32) are locked in phase, the voltage controlled delay line 32 outputs a signal that is generated by quarter-dividing the input signal period. However, the present invention is not intended to be limited to this as alternative divisions of the input signal are possible. Thus, the differential delay cell DDC1 outputs signals of 1/4 and 2/4 of one input signal period to the SR flip-flop 33. The differential delay cell DDC2 outputs signals of 1/4 and 2/4 of one input signal period to the SR flip-flop 34.

Figure 5A:
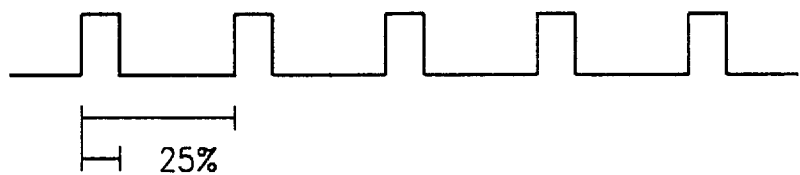
FIGS. 5A–5C are diagrams illustrating signal waveforms from the circuit of FIG. 3.
Figure 5B:
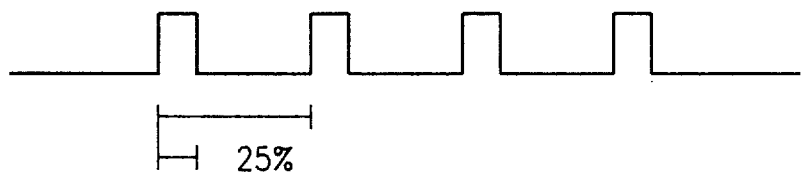

Accordingly, the SR flip-flop 33 receives a pair of output signals from the differential delay cell DDC1 of the voltage controlled delay line 32 and outputs a signal having a 25% duty cycle as shown in FIG. 5A. The SR flip-flop 34 receives a pair of output signals from the differential delay cells DDC2 of the voltage control delay line 32 and outputs a signal having a 25% duty cycle as shown in FIG. 5B.

Figure 5C:

When the OR-gate 35 ORs the output signals from the SR flip-flops 33 and 34 each of which signals has a 25% duty cycle, a frequency-doubled signal 2f1 having a 50% duty cycle is generated. The frequency-doubled signal 2f1 output by the OR-gate 35 is shown in FIG. 5C.

As described above, the preferred embodiment of the frequency multiplier according to the present invention has various advantages. The preferred embodiment of the frequency multiplier simplifies the construction of the multiplier by using the DLL structure instead of the PLL structure and reduces the loading of a loop filter in cooperation with the structural stability of the DLL circuit compared to the PLL, which has many poles. In particular, the layout area can be reduced by using a capacitor instead of the loop filter. Since a VCO is not used, the frequency multiplier circuit construction becomes simple and noise is significantly reduced. In addition, the duty cycle problem of the PLL frequency multiplier using the VCO oscillator VCO can be avoided.

The preferred embodiment of the frequency multiplier solves the duty cycle problem caused by the exclusive-OR gate in the related art DLL frequency multiplier. Further, the jitter problem of the related art DLL frequency multiplier is solved without additional circuitry. In addition, the number of required delay cells is reduced by differentially forming the delay cells. Accordingly, power source noise by the differential circuit can be eliminated.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art.

What is claimed is:

1. A frequency multiplier, comprising:
   a phase detector that detects a phase difference between an input signal and a feed-back signal;
   a loop filter that outputs a control signal based on the phase difference detected by the phase detector;
   a voltage-controlled delay unit that varies a delay ratio of the input signal and outputs a divided signal based on the control signal from the loop filter;
   a first latch circuit receives a first pair of output signals from the voltage-controlled delay unit and outputs a first duty cycle signal;
   a second latch circuit that receives a second pair of output signals from the voltage-controlled delay line and outputs a second duty cycle signal; and
   a logic-gate that logically processes the first and second duty cycle signals from the first and second latch circuits to output a signal with a predetermined duty cycle.

2. The frequency multiplier of claim 1, wherein the voltage controlled delay unit includes only two differential delay cells and outputs the feed-back signal.

3. The frequency multiplier of claim 2, wherein each of the differential delay cells comprises:
   first and second transistors coupled in parallel to a current source; and
   third and fourth transistors coupled in parallel to a first reference voltage,
   wherein control electrodes of the third and fourth transistors receive the control signal from the loop filter, and wherein the third and fourth transistors are respectively coupled in series between the first reference voltage and the first and second transistors.

4. The frequency multiplier of claim 3, wherein the current source is coupled to a second reference voltage, wherein the first and second transistors are NMOS transistors, the third and fourth transistors are PMOS transistors and the control electrode is a gate electrode, and wherein the first and second reference voltages are respectively a source voltage and a ground voltage.

5. The frequency multiplier of claim 2, wherein a first differential delay cell divides the input signal into 1/4 and 2/4 period signals, and a second differential delay cell divides the input signal into 3/4 and 4/4 period signals.

6. The frequency multiplier of claim 1, wherein the loop filter is a capacitor.

7. The frequency multiplier of claim 1, wherein the voltage-controlled delay unit outputs a quarter-divided signal.

8. The frequency multiplier of claim 1, wherein the first pair of output signals are divided into 1/4 and 2/4 of an input signal period, and wherein the second pair of output signals are divided into 3/4 and 4/4 of the input signal period.

9. The frequency multiplier of claim 1, wherein the first and second latch circuits are flip-flops.

10. The frequency multiplier of claim 1, wherein the first and second latch circuits are SR flip-flops.

11. The frequency multiplier of claim 1, wherein the first and second duty cycle signals are 25% duty cycles signals and the predetermined duty cycle is a 50% duty cycle.

12. The frequency multiplier of claim 1, wherein the logic-gate comprises an OR-gate.

13. The frequency multiplier of claim 1, wherein the voltage controlled delay line includes first and second differential delay cells, wherein a first input of the first differential delay cell is the input signal, wherein a first output signal of the second differential delay cell is fed back to a second input of the first differential delay cell, and wherein a second output signal of the second differential delay cell is the feed-back signal.

14. The frequency multiplier of claim 13, wherein each differential delay cell outputs quarter divided signals.

15. An output circuit for a frequency multiplier, comprising:
   a voltage-controlled delay unit that varies a delay ratio of an input signal and outputs a divided signal based on a difference between the input signal and a feed-back signal;
   a first output circuit receives a first pair of signals from the voltage-controlled delay unit and outputs a first duty cycle signal;
   a second output circuit that receives a second pair of signals from the voltage-controlled delay line and outputs a second duty cycle signal; and a logic circuit that logically processes the first and second duty cycle signals from the first and second output circuits to output a signal with a predetermined duty cycle.

16. The frequency multiplier of claim 15, wherein the voltage controlled delay unit includes two differential delay cells, wherein each of the differential delay cells comprises:

first and second transistors coupled in parallel to a current source; and third and fourth transistors coupled in parallel to a first reference voltage, wherein control electrodes of the third and fourth transistors receive a control signal, and wherein the third and fourth transistors are respectively coupled in series between the first reference voltage and the first and second transistors.

17. The frequency multiplier of claim 16, wherein the current source is coupled to a second reference voltage, wherein the first and second transistors are NMOS transistors, the third and fourth transistors are PMOS transistors and the control electrode is a gate electrode, and wherein the first and second reference voltages are respectively a source voltage and a ground voltage.

18. The frequency multiplier of claim 16, wherein a first differential delay cell divides the input signal into 1/4 and 2/4 period signals, and a second differential delay cell divides the input signal into 3/4 and 4/4 period signals.

19. The frequency multiplier of claim 15, wherein the first and second output circuits are latch circuits.

20. The frequency multiplier of claim 15, wherein the first and second duty cycle signals are 25% duty cycles signals and the predetermined duty cycle is a 50% duty cycle.

21. The frequency multiplier of claim 15, further comprising:

a phase detector that detects a phase difference between the input signal and the feed-back signal;

a capacitor that outputs a control signal based on the phase difference detected by the phase detector.

22. A frequency multiplier, comprising:

a detector that detects a difference between an input signal and a feed-back signal and outputs a control signal based on the detected difference;

a voltage-controlled delay line that varies a delay of the input signal and outputs the feed-back signal based on the control signal, wherein the voltage-controlled delay includes a plurality of delay elements;

a first output circuit that receives a first input/output pair of delay element signals from the voltage-controlled delay line and outputs a first duty cycle signal;

a second output circuit that receives a second input/output pair of delay element signals from the of the voltage-controlled delay line and outputs a second duty cycle signal; and a circuit that logically processes the first and second duty cycle signals from the first and second output circuits to output a signal with a prescribed duty cycle.

* * * * *